United States Patent
Lee et al.

(10) Patent No.: US 9,660,009 B2
(45) Date of Patent: May 23, 2017

(54) ORGANIC LIGHT EMITTING DIODE DISPLAY

(71) Applicant: SAMSUNG DISPLAY CO., LTD., Yongin-si, Gyeonggi-do (KR)

(72) Inventors: Ji Hye Lee, Yongin-si (KR); Yong-Koo Hur, Yongin-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 14/848,786

(22) Filed: Sep. 9, 2015

(65) Prior Publication Data
US 2016/0181341 A1 Jun. 23, 2016

(30) Foreign Application Priority Data
Dec. 22, 2014 (KR) .................. 10-2014-0186424

(51) Int. Cl.
*H01L 27/32* (2006.01)
*H01L 27/12* (2006.01)

(52) U.S. Cl.
CPC ........ *H01L 27/3262* (2013.01); *H01L 27/124* (2013.01); *H01L 27/1222* (2013.01); *H01L 27/1255* (2013.01); *H01L 27/3265* (2013.01); *H01L 27/3216* (2013.01); *H01L 27/3276* (2013.01)

(58) Field of Classification Search
CPC . H01L 27/32; H01L 27/3262; H01L 27/3376; H01L 27/3248; H01L 27/3258; H01L 27/3246; H01L 27/3265

USPC ............... 257/72, 213, 296; 345/212, 76
See application file for complete search history.

(56) References Cited

U.S. PATENT DOCUMENTS

| | | | | |
|---|---|---|---|---|
| 6,569,717 | B1* | 5/2003 | Murade | 438/149 |
| 7,298,351 | B2 | 11/2007 | Kim | |
| 2003/0155588 | A1* | 8/2003 | Murade | 257/213 |
| 2008/0079005 | A1* | 4/2008 | Tseng | 257/72 |
| 2013/0222355 | A1* | 8/2013 | Choi et al. | 345/211 |
| 2013/0328853 | A1* | 12/2013 | Hong | 345/212 |

FOREIGN PATENT DOCUMENTS

| | | |
|---|---|---|
| JP | 2013-113868 A | 6/2013 |
| KR | 10-2010-0049385 A | 5/2010 |

* cited by examiner

*Primary Examiner* — Sheng Zhu
(74) *Attorney, Agent, or Firm* — Lee & Morse, P.C.

(57) ABSTRACT

An organic light emitting diode display includes a scan line, a data line, and a driving voltage line connected to a pixel. The pixel includes a switching transistor connected to the scan line and the data line, a driving transistor connected to the switching transistor, and a compensation transistor to compensate a threshold voltage of the driving transistor. The pixel also includes a first data connector to connect the compensation transistor to the driving transistor, a first storage electrode corresponding to the driving gate electrode and connected to the driving voltage line, and a second storage electrode overlapping a first storage electrode. An extended portion of the second storage electrode is in an overlapped portion between the first data connector and the scan line.

20 Claims, 8 Drawing Sheets

ORGANIC LIGHT EMITTING DIODE DISPLAY

CROSS-REFERENCE TO RELATED APPLICATION

Korean Patent Application No. 10-2014-0186424, filed on Dec. 22, 2014, and entitled, "Organic Light Emitting Diode Display," is incorporated by reference herein in its entirety.

BACKGROUND

1. Field

One or more embodiments herein relate to an organic light emitting device.

2. Description of the Related Art

An organic light emitting diode display generates images based on light emitted from a plurality of pixels. Each pixel includes an organic light emitting diode formed from an emission layer between two electrodes. In operation, electrons injected from one electrode and holes injected from the other electrode combine in the emission layer to generate an excitons. Light is emitted when the excitons change state. An organic light emitting diode display is therefore considered to be self-emission type of display.

The pixels of an organic light emitting diode may have various structures. In one type of pixel, a storage capacitor, a switching transistor, and a driving transistor are included to control operation of the organic light emitting diode. The driving transistor controls flow of driving current to the organic light emitting diode. The storage capacitor is connected to a driving gate node of the driving transistor and stores a voltage which is based on a data voltage for one frame. With this arrangement, during one frame, a constant amount of driving current is supplied to the organic light emitting diode from the driving transistor to induce the emission of light.

However, parasitic capacitance may occur between the driving gate node of the driving transistor and a data line and/or between the driving gate node of the driving transistor and an overlapped portion of a scan line. As a result, a voltage change in the data line or a scan signal of the scan line may affect the voltage of the driving gate node of the driving transistor. This, in turn, may change the driving current flowing to the organic light emitting diode, thereby causing vertical crosstalk that generates luminance variation that deteriorates display quality.

One approach which has been proposed in an attempt to prevent crosstalk involves forming a large gap between the data line and the driving gate node. However, this approach may be inadequate and may not be able to be performed in all cases. For example, in a high-resolution display, the size of the pixels is very small and thus may not accommodate formation of the gap. Also, process design rules may not be able to be gradually reduced due to limits in equipment specification and photolithography capacity. These effects deter efforts to minimize pixel size and also prevent any significant reduction in vertical crosstalk.

SUMMARY

In accordance with one or more embodiments, an organic light emitting diode (OLED) display includes a substrate; a scan line, on the substrate, to transmit a scan signal; a data line and a driving voltage line, crossing the scan line, to respectively transmit a data voltage and a driving voltage; a switching transistor connected to the scan line and the data line; a driving transistor connected to the switching transistor; a compensation transistor to compensate a threshold voltage of the driving transistor, the compensation transistor to turn on according to the scan signal and connected to a driving drain electrode of the driving transistor; a first data connector to connect a compensation drain electrode of the compensation transistor and a driving gate electrode of the driving transistor; a second storage electrode overlapping a first storage electrode corresponding to the driving gate electrode and connected to the driving voltage line; and an OLED connected to the driving transistor, wherein an extended portion of the second storage electrode is in an overlapped portion between the first data connector and the scan line.

The display may include a first gate insulating layer, a second gate insulating layer, and an interlayer insulating layer sequentially formed on the substrate, wherein the second storage electrode is between the second gate insulating layer and the interlayer insulating layer. The scan line may be between the first gate insulating layer and the second gate insulating layer, and the first data connector may be on the interlayer insulating layer. The first storage electrode may be between the first gate insulating layer and the second gate insulating layer, and the first storage electrode may correspond to the driving gate electrode. The second storage electrode may entirely cover the first storage electrode.

The first data connector may be in a same layer as the data line and the driving voltage line. The first data connector may have a first end connected to the driving gate electrode through a contact hole in the second gate insulating layer and the interlayer insulating layer and a second end connected to the compensation drain electrode of the compensation transistor through a contact hole in the first gate insulating layer, the second gate insulating layer, and the interlayer insulating layer.

The second storage electrode may include a storage opening exposing the second gate insulating layer, and a contact hole through which the first end of the first data connector and the driving gate electrode are connected is in the storage opening. The first data connector may be separated from the data line on a same plane. A driving channel of the driving transistor may be bent on a same plane.

The organic light emitting diode includes a pixel electrode connected to the driving transistor; an organic emission layer on the pixel electrode; and a common electrode on the organic emission layer, the pixel electrode separated from the first data connector on as same plane. The display may include a passivation layer covering the data line, the driving voltage line, and the first data connector; a pixel defining layer covering an edge of the pixel electrode on the passivation layer; and an initialization voltage line in a same layer as the pixel electrode, the initialization voltage line to transmit an initialization voltage to initialize the driving transistor.

In accordance with one or more other embodiments, a pixel includes a switching transistor connected to a scan line; a driving transistor connected to the switching transistor; a compensation transistor to compensate a threshold voltage of the driving transistor based on a scan signal; a first data connector to connect the compensation transistor to the driving transistor; a first storage electrode corresponding to a gate electrode of the driving transistor; and a second storage electrode overlapping a first storage electrode, wherein the second storage electrode includes an extended portion which overlaps the first data connector and the scan line.

The second storage electrode may be between a second gate insulating layer and an interlayer insulating layer. The scan line may be between a first gate insulating layer and the second gate insulating layer, and the first data connector may be on the interlayer insulating layer. The first storage electrode may be between the first gate insulating layer and the second gate insulating layer, and the first storage electrode may correspond to the driving gate electrode. The second storage electrode may entirely cover the first storage electrode. The first data connector may be in a same layer as a data line and a driving voltage line. The first data connector may be separated from a data line on a same plane. A driving channel of the driving transistor may curve on a same plane.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
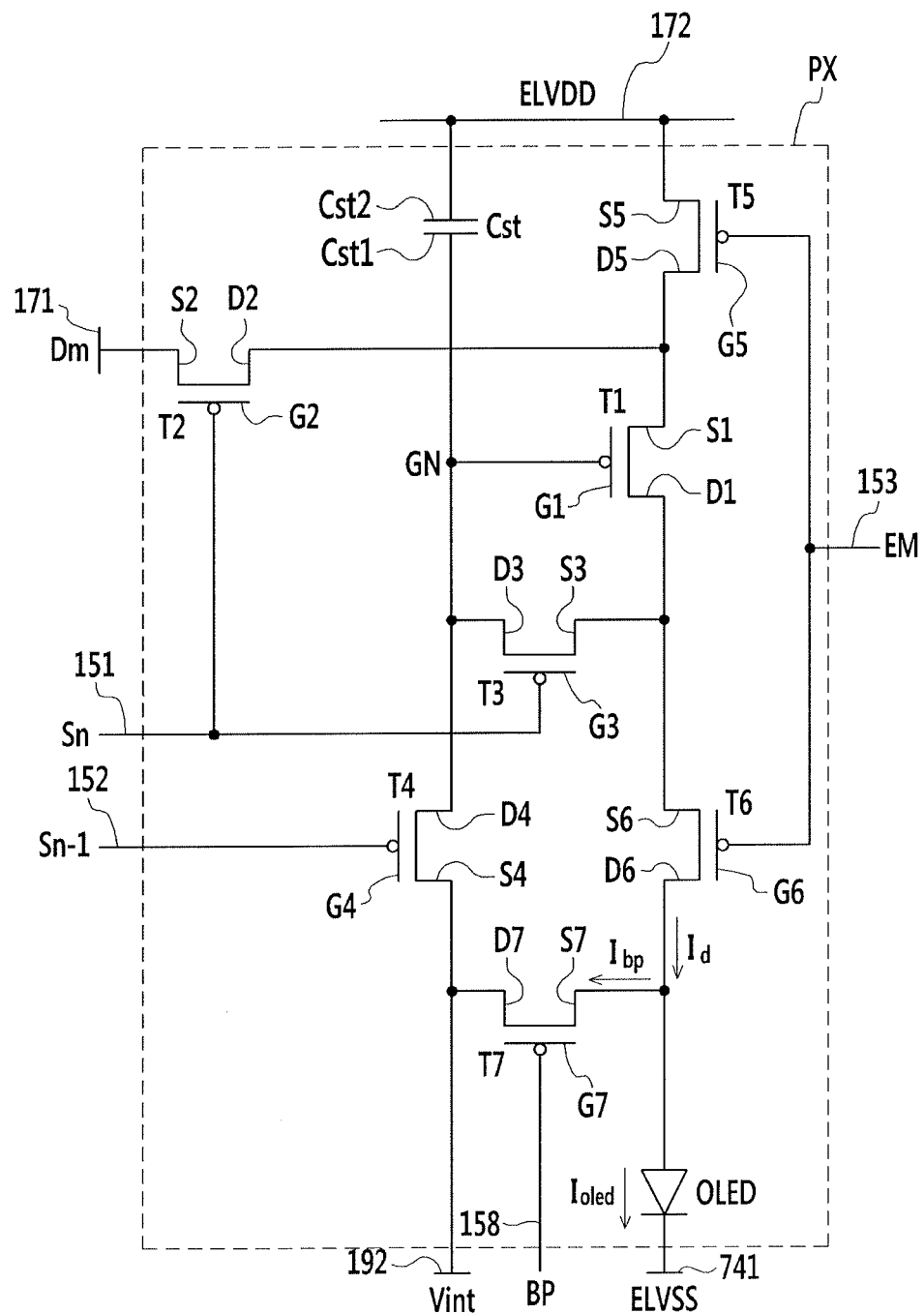
FIG. 1 illustrates an embodiment of a pixel.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In the drawings, an active matrix (AM) type organic light emitting diode display is illustrated to include embodiments of a 7Tr-1Cap pixel structure in which seven thin film transistors (TFTs) and one capacitor. In another embodiment, the organic light emitting diode display may have a different pixel structure with a different number of transistors and/or capacitors. Also, in at least one embodiment, a pixel corresponds to a minimum unit for displaying light included in an image.

FIG. 1 illustrates an embodiment of a pixel PX which is representative of a plurality of pixels of an organic light emitting display device. As shown in FIG. 1, the pixel PX includes a plurality of transistors, a storage capacitor Cst, and an organic light emitting diode OLED. The transistors are connected to a plurality of signal lines.

The transistors include a driving transistor T1, a switching transistor T2, a compensation transistor T3, an initialization transistor T4, an operation control transistor T5, an emission control transistor T6, and a bypass transistor T7. The signal lines include a scan line 151, an previous scan line 152 transmitting a previous scan signal Sn-2 to the initialization transistor T4, an emission control line 153 transmitting an emission control signal EM to the operation control transistor T5 and the emission control transistor T6, a bypass control line 158 crossing the scan line 151 and transmitting a bypass signal BP to the bypass transistor T7, and a driving voltage line 172 transmitting a driving voltage ELVDD and extending almost in parallel with a data line 171, and an initialization voltage line 192 transmitting an initialization voltage Vint for initialization of the driving transistor T1.

The driving transistor T1 includes a gate electrode G1 connected to a first end Cst1 of the storage capacitor Cst, a source electrode S1 connected to the driving voltage line 172 via the operation control transistor T5, and a drain electrode D1 connected to an anode of the organic light emitting diode OLED via the emission control transistor T6. The driving transistor T1 receives a data signal Dm according to a switching operation of the switching transistor T2 and supplies a driving current Id to the organic light emitting diode OLED.

The switching transistor T2 includes a gate electrode G2 connected to the scan line 151, a source electrode S2 connected to the data line 171, and a drain electrode D2 connected to the source electrode S1 of the driving transistor T1 and the driving voltage line 172 via the operation control transistor T5. The switching transistor T2 is turned on according to a scan signal Sn transmitted through the scan line 151 and performs a switching operation to transmit the data signal Dm to the source electrode S1 of the driving transistor T1.

The compensation transistor T3 includes a gate electrode G3 connected to the scan line 151, a source electrode S3 connected to the drain electrode D1 of the driving transistor T1 and an anode of the organic light emitting diode OLED via the emission control transistor T6, and a drain electrode D3 connected to a drain electrode D4 of the initialization transistor T4, a first end C1 of the storage capacitor Cst, and the gate electrode G1 of the driving transistor T1. The compensation transistor T3 is turned on according to a scan signal Sn transmitted through the scan line 151 and diode-connects the driving transistor T1 by connecting the gate electrode G1 and the drain electrode D1 of the driving transistor T1.

The initialization transistor T4 includes a gate electrode G4 connected to the previous scan line 152, a source electrode S4 connected to the initialization voltage line 192, and the drain electrode D4 connected to the first end Cst1 of the storage capacitor Cst and the gate electrode G1 of the driving transistor T1 through the drain electrode D3 of the compensation transistor T3. The initialization transistor T4 is turned on according to a previous scan signal Sn-1 transmitted through the previous scan line 152, and performs an initialization operation to initialize a gate voltage of the gate electrode G1 of the driving transistor T1 by transmitting an initialization voltage Vint to the gate electrode G1 of the driving transistor T1.

The operation control transistor 15 includes a gate electrode G5 connected to the emission control line 153, a source electrode S5 connected to the driving voltage line 172, and a drain electrode D5 connected to the source electrode S1 of the driving transistor T1 and the drain electrode S2 of the switching transistor T2.

The emission control transistor T6 includes a gate electrode G6 connected to the emission control line 153, a source electrode S6 connected to the drain electrode D1 of the driving transistor T1 and the source electrode S3 of the compensation transistor T3, and a drain electrode D6 connected to the anode of the organic light emitting diode OLED. The operation control transistor T5 and the emission control transistor T6 are simultaneously turned on according to the emission control signal EM transmitted through the emission control line 153. Thus, the driving voltage ELVDD is compensated through the diode-connected driving transistor T1 and then transmitted to the organic light emitting diode OLED.

The bypass transistor T7 includes a gate electrode G7 connected to the bypass control line 158, a source electrode S7 connected to a drain electrode D6 of the emission control transistor T6 and the anode of the organic light emitting diode OLED, and a drain electrode D7 connected to the initialization voltage line 192 and the source electrode D4 of the initialization thin film transistor T4. The bypass control line 158 is connected to the previous scan line 152 and therefore the bypass signal BP is the same as the previous scan signal Sn-1.

The storage capacitor Cst includes a second end Cst2 connected to the driving voltage line 172. The cathode of the organic light emitting diode OLED is connected to a common voltage line 741 transmitting a common voltage ELVSS.

Thus, in the present embodiment, the pixel PX has a seven transistor-one capacitor structure. In another embodiment, the organic light emitting diode display may have a different pixel structure with a different number of transistors and/or capacitors.

Figure 2:
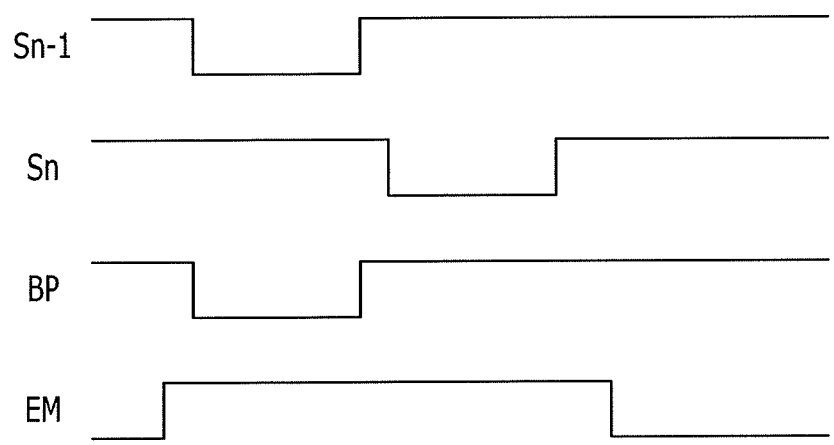
FIG. 2 illustrates an example of control signals for the pixel.

FIG. 2 illustrates an embodiment of control signals for the pixel PX of the OLED. As illustrated in FIG. 2, during an initialization period, a low-level previous signal Sn-1 is supplied through the previous scan line 152. Then, the initialization transistor T4 is turned on based on the low-level previous scan signal Sn-1, and the initialization voltage Vint is connected to the gate electrode G1 of the driving transistor T1 through the initialization transistor T4. Thus, the driving transistor T1 is initialized by the initialization voltage Vint.

Next, during a data programming period, a low-level scan signal Sn is supplied through the scan line 151. Then, the switching transistor T2 and the compensation transistor T3 are turned on based on the low-level scan signal Sn. In this case, the driving transistor T1 is diode-connected by the turned-on compensation transistor T3 and therefore is biased in a forward direction.

A compensation voltage Dm+Vth (here, Vth has a negative value) is acquired by subtracting a threshold voltage Vth of the driving transistor T1 from a data signal Dm supplied from the data line 171. The compensation voltage Dm+Vth is applied to the gate electrode G1 of the driving transistor T1. The driving voltage ELVDD and the compensation voltage Dm+Vth are applied to ends of the storage capacitor Cst, and a charge corresponding to a voltage difference between the voltages applied to the ends is stored in the storage capacitor Cst.

Next, during a light emission period, the emission control signal EM from the emission control line 153 changes from high level to a low level. The operation control transistor T5 and the emission control transistor T6 are turned on by the low-level emission control signal EM. Thus, a driving current Id is generated that depends on a voltage difference between the gate voltage of the gate electrode G1 of the driving transistor T1 and the driving voltage ELVDD. The driving current Id is supplied to the organic light emitting diode OLED through the emission control transistor T6.

Also, during the light emission period, a driving gate-source voltage Vgs of the driving transistor T1 is maintained at (Dm+Vth)-ELVDD by the storage capacitor Cst. According to a current-voltage relationship of the driving transistor T1, the driving current Id is proportional to the square $(Dm-ELVDD)^2$ of a value acquired by subtracting the threshold voltage Vth from the driving gate-source voltage Vgs. Thus, the driving current Id is determined without regard to the threshold voltage Vth of the driving transistor T1.

Also, the bypass transistor T7 receives the bypass signal BP from the bypass control line 158. Thus, a part of the driving current Id is leaked as bypass current Ibp through the bypass transistor T7.

When the minimum current of the driving transistor T1 for displaying a black image flows as a driving current, the organic light emitting diode OLED emits light and the black image therefore may not be properly displayed. Thus, the bypass transistor T7 may disperse part of the minimum current of the driving transistor T1 to current paths other than a current path toward the organic light emitting diode OLED as the bypass current Ibp. In at least one embodiment, the minimum current of the driving transistor T1 may be understood to correspond to a current which turns off the driving transistor T1 under the condition where the driving gate-source voltage Vgs of the driving transistor T1 is lower than the threshold voltage Vth.

The minimum driving current (e.g., a current lower than 10 pA) for turning off the driving transistor T1 is transmitted to the organic light emitting diode OLED, to thereby effect display of an image with black luminance. When the minimum driving current for displaying a black image flows, influence of bypass transmission of the bypass current Ibp may be significant. However, when a high driving current for displaying, for example, a general image or a white image flows, the bypass current Ibp has almost no influence.

Thus, when the driving current for displaying a black image flows, a light emission current Ioled (reduced by the amount of bypass current Ibp leaked through the bypass transistor T7 from the driving current Id) has a minimum amount of current for clearly representing the black image. Therefore, an image having precise black luminance may be realized using the bypass transistor T7. This may have the effect of improving contrast ratio. In FIG. 2, the bypass signal BP is equivalent to the previous scan signal Sn-1. However, the bypass signal BP may be a different signal in another embodiment.

Figure 3:
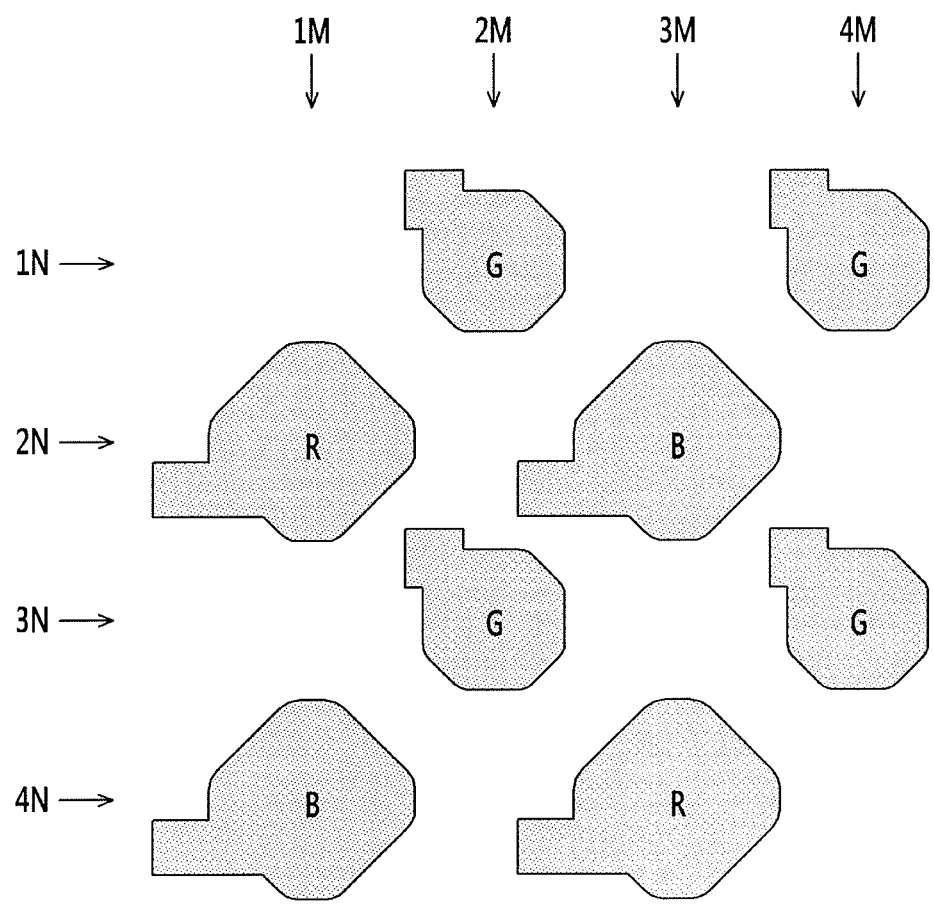
FIG. 3 illustrates an embodiment of a plurality of pixels.

FIG. 3 illustrates an embodiment of a plurality of pixels of the OLED display. The plurality of pixels include green pixels G arranged at a predetermined distance from each other in a first row 1N, red pixels R and blue pixels G alternately arranged in a second row 2N adjacent to the first row 1N, green pixels G arranged at a predetermined distance from each other in a third row 3N adjacent to the second row 2N, and blue pixels B and red pixels B alternately arranged in a fourth row 4N adjacent to the third row 3N. This arrangement of pixels is repeated to an N-th row.

The green pixels G in the first row 1N and the red pixels R and the blue pixels B in the second row 2N are not aligned with each other. Thus, the red pixels R and the blue pixels B are alternately arranged in a first column 1M, green pixels G are arranged at a predetermined distance from each other in a second column 2M adjacent to the first column 1M, blue pixels B and red pixels R are alternately arranged in a third column 3M adjacent to the second column 2M, and green pixels G are arranged at a distance from each other in a fourth column 4M adjacent to the third column 3m, and such an alignment of the pixels is repeated to an M-th column.

Such a pixel alignment structure is called a pentile matrix type of pixel structure. In such a structure, colors are expressed by sharing adjacent pixels to thereby realize high resolution with a small number of pixels.

Figure 4:
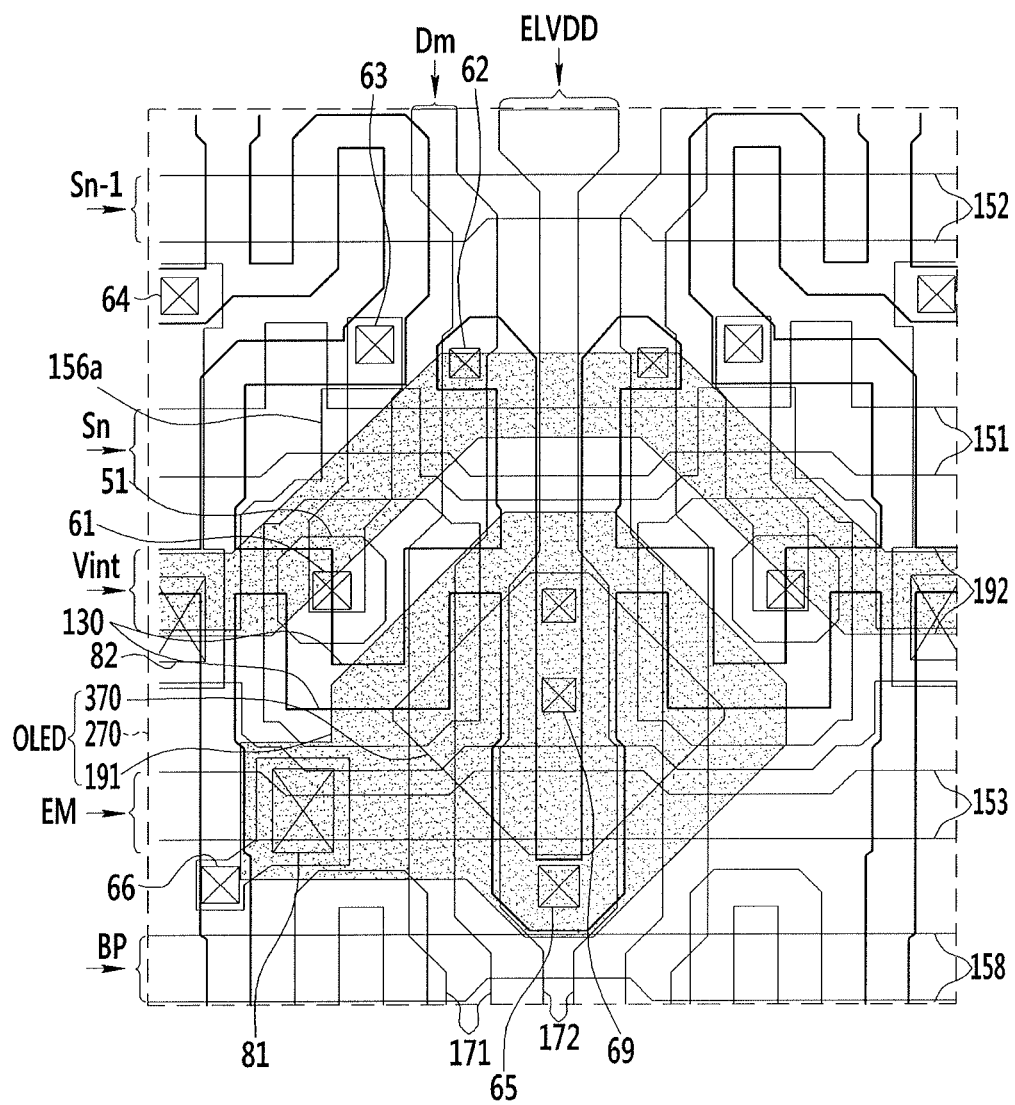
FIG. 4 illustrates an embodiment of an organic light emitting display device.
Figure 5:
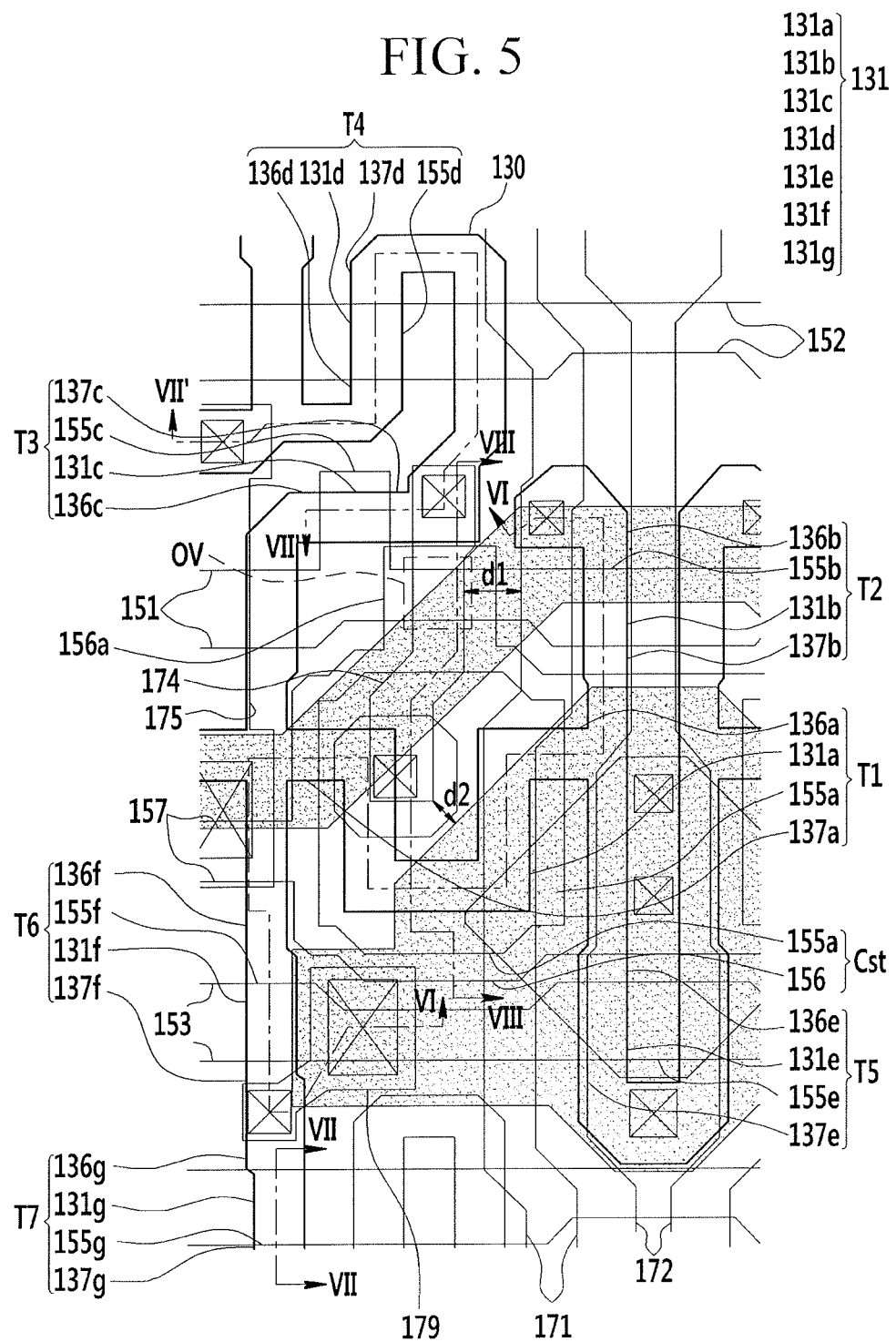
FIG. 5 illustrates an embodiment of a layout of a pixel in FIG. 4.

FIG. 4 illustrates an embodiment of a layout of an OLED display including a plurality of transistors and a capacitor. FIG. 5 is a cross-sectional view of the OLED display of FIG. 5 taken along line VI-VI. FIG. 7 is a cross-sectional view of the OLED display of FIG. 5 taken along lines VII-VII and VII'-VII'. FIG. 8 is a cross-sectional view of the OLED display of FIG. 8 taken along line VIII-VIII. A detailed planar structure of one embodiment of the organic light emitting diode display will be first described with reference to FIGS. 4 and 5, and a detailed cross-sectional structure will then be described with reference to FIGS. 6 to 8.

Referring to FIGS. 4 and 5, the display includes a scan line 151, a previous scan line 152, an emission control line 153, and a bypass control line 158 extending a a row direction. These lines respectively transmit a scan signal Sn, a previous scan signal Sn-1, an emission control signal EM, and a bypass signal BP. In addition, the display includes a data line 171 and a driving voltage line 172 that crossing the scan line 151, the previous scan line 152, the emission control line 153, and the bypass control line 158. The data line 171 and the driving voltage line 172 respectively apply a data signal Dm and a driving voltage ELVDD to a pixel PX. An initialization voltage Vint is transmitted to compensation transistor T3 via initialization transistor T4 from an initialization voltage line 192. The initialization voltage line 192 includes a straight line portion between diagonal line portions which are alternately formed.

As previously discussed, the pixel PX includes a driving transistor T1, a switching transistor T2, a compensation transistor T3, an initialization transistor T4, an operation control transistor 15, an emission control transistor T6, a bypass transistor T7, a storage capacitor Cst, and an organic light emitting diode OLED. The pixel PX in FIGS. 4 and 5 may correspond to a red pixel R or a blue pixel B of a pentile matrix structure.

Also, as previously discussed, the organic light emitting diode OLED includes a pixel electrode 191, an organic emission layer 370, and a common electrode 270. The compensation transistor T3 and the initialization transistor T4 are formed with a dual-gate structure for preventing leakage current.

Each channel of the driving transistor T1, the switching transistor T2, the compensation transistor T3, the initialization transistor T4, the operation control transistor T5, the emission control transistor T6, and the bypass transistor T7 may be formed on or in one semiconductor layer 130, which, for example, may bend in various shapes. The semiconductor layer 130 may include, for example, polysilicon or oxide semiconductor.

In one embodiment, the oxide semiconductor material may include one or more oxides based on titanium (Ti), hafnium (Hf), zirconium (Zr), aluminum (Al), tantalum (Ta), germanium (Ge), zinc (Zn), gallium (Ga), tin (Sn), or indium (In), and zinc oxide (ZnO), indium-gallium-zinc oxide (In-GaZnO4), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O) which are complex oxides thereof. When the semiconductor layer 130 is formed of an oxide semiconductor, a separate passivation layer may be added to protect the oxide semiconductor from external environmental influences such as high temperatures.

The semiconductor layer 130 includes or supports a channel region, a source region, and a drain region. The channel region includes a channel doped with an N-type impurity or a P-type impurity. The source region and the drain region are formed at respective sides of the channel region and are formed by a doping impurity opposite in type to the doping impurity of the channel region. In one example embodiment, the source doping region and the drain doping region respectively correspond to a source electrode and a drain electrode. The source electrode and the drain electrode in or on the semiconductor layer 130 may be formed, for example, by doping only the corresponding regions. Also, a source electrode and a drain electrode in a region between a source electrode and a drain electrode of different transistors may be connected to each other.

Referring to FIG. 5, a channel 131 includes a driving channel 131a in the driving transistor T1, a switching channel 131b in the switching transistor T2, a compensation channel 131c in the compensation transistor T3, an initialization channel 131d in the initialization transistor T4, an operation control channel 131e in the operation control transistor T5, a light emission control channel 131f in the light emission control transistor T6, and a bypass channel 131g in the bypass transistor T7.

The driving transistor T1 includes the driving channel 131a, a driving gate electrode 155a, a driving source electrode 136a, and a driving drain electrode 137a. The driving channel 131a is curved, e.g., may have an meandering shape or a zigzag shape. As such, the driving semiconductor layer 131a may be elongated in a narrow space.

The driving range of a gate-source voltage Vgs between the driving gate electrode 155a and the driving source electrode 136a is increased by the elongated driving channel 131a. An increase in the driving range of the driving-gate source gray scales of light emitted from the organic light emitting diode OLED to be more finely controlled by changing the magnitude of the gate-source voltage Vgs, This increased control allows for enhanced resolution of the OLED display and improved display quality. The driving channel 131a may have various curved shapes, e.g., reverse S, S, M, and W.

The driving gate electrode 155a overlaps the driving channel 131a, and the driving source electrode 136a and the driving drain electrode 137a are respectively formed adjacent to ends of the driving channel 131a. The driving gate electrode 155a is connected to a first data connection member 174 through a contact hole 61.

The switching transistor T2 includes the switching channel 131b, a switching gate electrode 155b, a switching source electrode 136b, and a switching drain electrode 137b. The switching gate electrode 155b is a part expanded downward from the scan line 151 which overlaps the switching channel 131b. The switching source electrode 136b and the switching drain electrode 137b are are adjacent to respective ends of the switching channel 131b. The switching source electrode 136b is connected to the data line 171 through a contact hole 62.

The compensation transistor T3 includes the compensation channel 131c, a compensation gate electrode 155c, a compensation source electrode 136c, and a compensation drain electrode 137c. Two compensation gate electrodes 155c are part of the scan line 151, overlap the compensation channel 131c, and are provided for reducing or preventing a leakage current. The compensation source electrode 136c and the compensation drain electrode 137c are formed adjacent respective ends of the compensation channel 131c. The compensation drain electrode 137c is connected to a first data connection member 174 through a contact hole 63.

The initialization transistor T4 includes the initialization channel 131d, an initialization gate electrode 155d, an initialization source electrode 136d, and an initialization drain electrode 137d. Two gate electrodes 155d are part of the previous scan line 152, overlap the initialization channel 131d, and are provided to prevent leakage current The initialization source electrode 136d and the initialization drain electrode 137d are adjacent respective ends of the initialization channel 131d. The initialization source electrode 136d is connected to a second data connection member 175 through a contact hole 64.

The operation control transistor T5 includes the operation control channel 131e, an operation control gate electrode 155e, an operation control source electrode 136e, and an operation control drain electrode 137e. The operation control gate electrode 155e is part of the emission control line 153 and overlaps the operation control gate electrode 155e. The operation control source electrode 136e and the operation control drain electrode 137e are adjacent respective ends of the operation control channel 131e. The operation control source electrode 136e is connected to an expanded part of the driving voltage line 172 through a contact hole 65.

The emission control transistor T6 includes the emission control channel 131f, an emission control gate electrode 155f, an emission control source electrode 136f, and an emission control drain electrode 137f. The emission control gate electrode 155f is part of the emission control line 153 and overlaps the emission control channel 131f. The emission control source electrode 136f and the emission control drain electrode 137f are adjacent to respective ends of the emission control channel 131f. The emission control drain electrode 137f is connected to a third data connection member 179 through a contact hole 66.

The bypass transistor T7 includes the bypass channel 131g, a bypass gate electrode 155g, a bypass source electrode 136g, and a bypass drain electrode 137g. The bypass gate electrode 155g is part of the bypass control line 158 and overlaps the bypass channel 131g, The bypass source electrode 136g and the bypass drain electrode 137g are adjacent respective ends of the bypass channel 131g.

The bypass source electrode 136g is directly connected to the emission control drain electrode 137f, and the bypass drain electrode 137g is directly connected to the initialization source electrode 136d.

The driving channel 131a of the driving transistor T1 has a first end connected to the switching drain electrode 137b and the operation control drain electrode 137e, and a second end connected to the compensation source electrode 136c and the emission control source electrode 136f.

The storage capacitor Cst has a second gate insulating layer 142 between a first storage electrode 155a and a second storage electrode 156. The first storage electrode 155a corresponds to the driving gate electrode 155a and is a part expanded from the storage line 157. The second storage electrode 156 wholly covers the driving gate electrode 155a while occupying a wider area than the driving gate electrode 155a. Such a second storage electrode 156 includes an extended portion 156a extended upward to overlap the first data connecting member 174.

The second gate insulating layer 142 serves as a dielectric material. Storage capacitance is determined by a charge charged in the storage capacitor Cst and a voltage between the capacitor plates 155a and 156. As described, the driving gate electrode 155a serves as the first storage electrode 155a to provide space for forming the storage capacitor in a space that is reduced as a result of the driving channel 131a occupying a large area in the pixel.

The first storage electrode 155a is the driving gate electrode 155a and is connected to a first end of the first data connection member 174 through the contact hole 61 and a storage opening 51. The storage opening 51 is formed in the second storage electrode 156. Thus, the contact hole 61, through which the first end of the first data connection member 174 and the driving gate electrode 155a are connected, is formed in the storage opening 156. The first data connecting member 174 is formed almost in parallel with the data line 171 in the same layer as the data line 171. A second end of the first data connecting member 174 is connected to the compensation drain electrode 137c of the compensation transistor T3 and the initialization drain electrode 137d of the initialization transistor T4. Thus, the first data connecting member 174 connects the driving gate electrode 155a, the compensation drain electrode 137c of the compensation transistor T3, and the initialization drain electrode 137d of the initialization transistor T4. The first data connecting member 174 corresponds to the driving gate node GN in the equivalent circuit diagram of FIG. 1.

The second storage electrode 156 is connected to the driving voltage line 172 through a contact hole 69.

Thus, the storage capacitor Cst stores storage capacitance corresponding to a difference between the driving voltage ELVDD transmitted to the second storage electrode 156 through the driving voltage line 172 and the driving gate voltage Vg of the driving gate electrode 155a.

The extended portion 156a of the second storage electrode 156 overlaps the first data connection member 174 connected to the driving gate electrode 155a. Therefore, the size of an overlapped area of the storage capacitor Cst is increased, to thereby enhance storage capacitance.

The first data connecting member 174 extends in parallel with the data line 171 and is separated by a first distance dl on the plane from the data line 171. Parasitic capacitance between the first data connection member 174 and the data line 171 may be reduced or minimized by increasing or maximizing the first distance d1.

The first data connection member 174 extends in parallel with the data line 171 and crosses the scan line 151. Thus, parasitic capacitance is generated in an overlapped portion OV between the scan line 151 and the first data connecting member 174.

However, in accordance with one or more embodiments, the extended portion 156a of the second storage electrode 156 to which the driving voltage is applied is located in the overlapped portion OV between the first data connecting member 174 and the scan line 151. Accordingly, generation of parasitic capacitance in the overlapped portion OV between the first data connecting member 174 and the scan line 151 may be reduced or prevented.

In addition, a kickback voltage caused by parasitic capacitance may be reduced or minimized. As a result, variation of the driving gate voltage Vg of the driving gate electrode 155a connected to the first data connection member 174, which is the driving gate node GN, may be reduced minimized, thereby minimizing vertical crosstalk.

Further, the data voltage Dm may be increased by reducing or minimizing the kickback voltage caused by parasitic capacitance. As a result, the driving range of a driving gate-source voltage Vgs between the driving gate electrode 155a and the driving source electrode 136a connected to the first data connection member 174 may be increased. Accordingly, the gray scale of light emitted from the organic light emitting diode OLED may be more finely controlled, and thus a resolution of the OLED display may be enhanced and display quality improved.

The third data connecting member 179 is connected to the pixel electrode 191 through a contact hole 81. The second data connecting member 175 is connected to the initialization voltage line 192 through a contact hole 82.

In this case, the first data connecting member 174 is separated by a second distance d2 on the plane from the pixel electrode 191. For example, an outer edge line of the first end of the first data connecting member 174 and an outer edge line of the pixel electrode 191 that face each other on the plane have the second distance d2. Thus, the first data connecting member 174 does not overlap the pixel electrode 191. Accordingly, no parasitic capacitance is generated between the first data connecting member 174 and the pixel electrode 191. As a result, kickback voltage from parasitic capacitance may be reduced or minimized, to thereby reduce or minimize variation of the driving gate voltage Vg of the driving gate electrode 155a connected to the first data connection member 174, which is the driving gate node GN. Vertical crosstalk may therefore be reduced or minimized.

Figure 6:
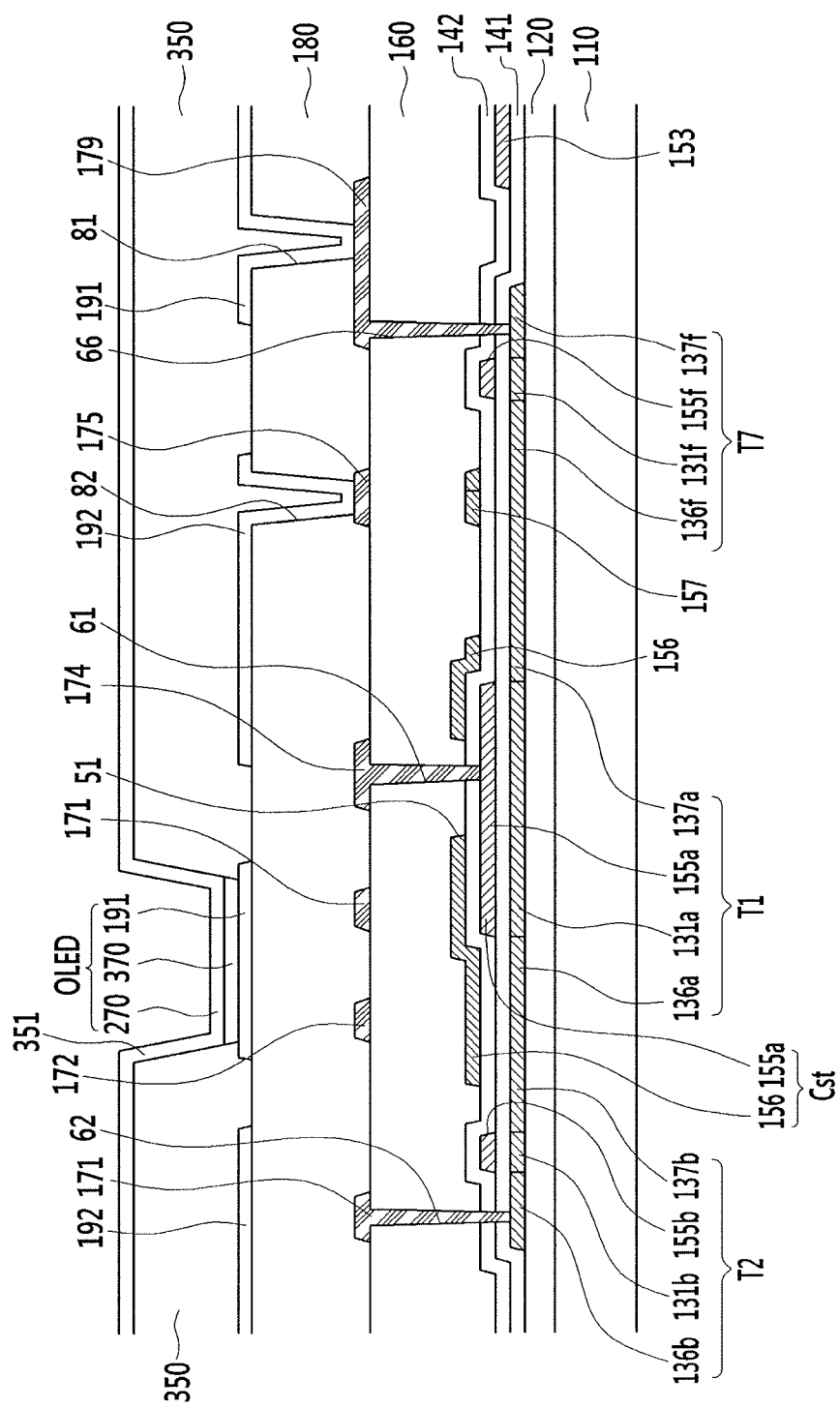
FIG. 6 illustrates a view of the display device along section line VI-VI.
Figure 7:
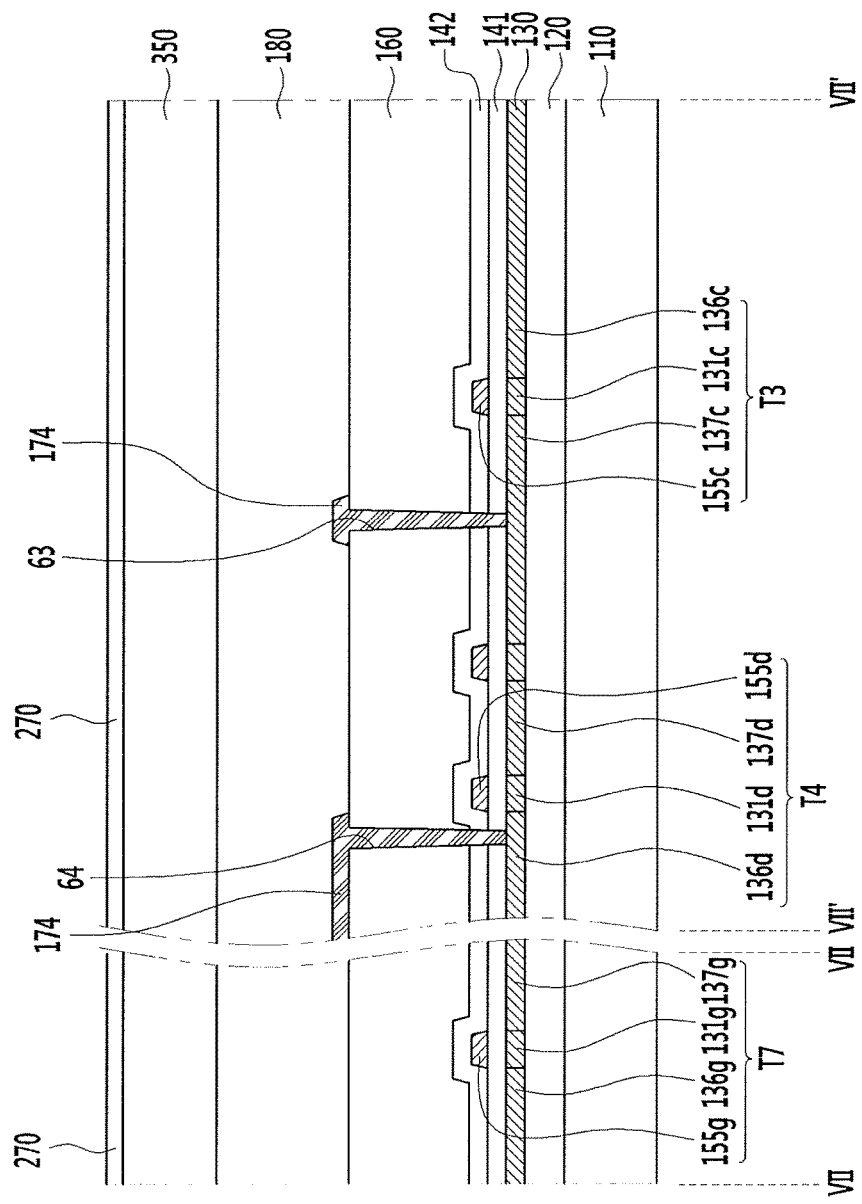
FIG. 7 illustrates a view of the display device along section line VII-VII and section line VII'-VII'.
Figure 8:
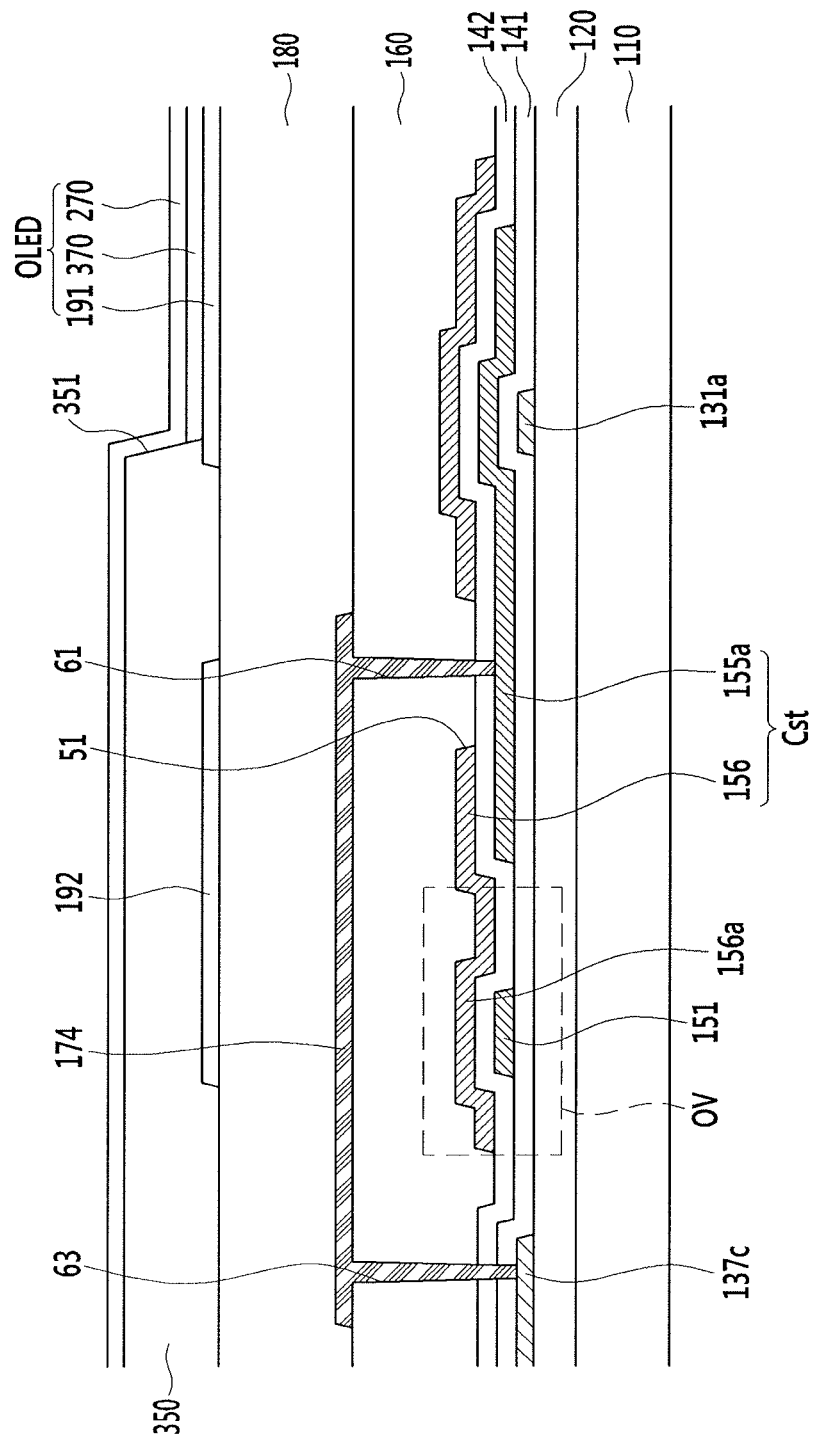
FIG. 8 illustrates a view of the display device along section line VIII-VIII.

FIGS. 6 to 8 illustrate embodiments of a cross-sectional structure of the OLED display. In these embodiments, a lamination structure of the operation control transistor T5 may almost be the same as that of the emission control transistor T6.

A buffer layer 120 is formed on a substrate 110. The substrate 110 may be an insulation substrate made of an insulation material, e.g., glass, quartz, ceramic, or plastic. The buffer layer 120 blocks an impurity from the substrate 110 during a crystallization process for forming a polycrystalline semiconductor in order to improve a feature of the polycrystalline semiconductor, and may reduce stress applied to the substrate 110.

The semiconductor layer 130 includes channels 131 that include the driving channel 131a, the switching channel 131b, the compensation channel 131c, the initialization channel 131d, the operation control channel 131e, the emission control channel 131f, and the bypass channel 131g is formed on the buffer layer 120. The driving source electrode 136a and the driving drain electrode 137a are formed at respective ends of the driving channel 131a. The switching source electrode 136b and the switching drain electrode 137b are formed at respective ends of the switching channel 131b.

In addition, the compensation source electrode 136c and the compensation drain electrode 137c are formed at respective ends of the compensation channel 131c. The initialization source electrode 136d and the initialization drain electrode 137d are formed at respective ends of the initialization channel 131d. Further, the operation control source electrode 136e and the operation control drain electrode 137e are formed at respective ends of the operation control channel 131e. The emission control source electrode 136f and the emission control drain electrode 137f are formed at respective ends of the emission control channel 131f. The bypass source electrode 136g and the bypass drain electrode 137g are formed at respective ends of the bypass channel 131g.

A first gate insulating layer 141 is formed on and covers at least a portion of the semiconductor layer 130. First gate wires including the scan line 151 include the switching gate electrode 155b and the compensation gate electrode 155c, the previous scan line 152 including the initialization gate electrode 155d, and the emission control line 153 including the operation control gate electrode 155e and the emission control gate electrode 155f, and the bypass control line 158 including the bypass gate electrode 155g are formed on the first gate insulating layer 141.

A second gate insulating layer 142 covers the first gate wires 151, 152, 153, 158, 155a, 155b, 155c, 155d, 155e, and 155f. The first gate insulating layer 141 is formed on the first gate wires 151, 152, 153, 158, 155a, 155b, 155c, 155d, 155e, and 155f and the first gate insulating layer 141. The first gate insulating layer 141 and the second gate insulating layer 142 may include, for example, a silicon nitride (SiNx) or a silicon oxide (SiOx) material.

The second gate wires 157 and 156 including the storage line 157 disposed in parallel with the scan line 151 and the second storage electrode 156, which is a part extended from the storage line 157, are formed on the second gate insulating layer 142. The second storage electrode 156 includes an extended portion 156a overlapping the first data connecting member 174.

The second storage electrode 156 is wider than the first storage electrode 155a, which functions as a driving gate electrode. Therefore, the second storage electrode 156 may entirely cover the driving gate electrode 155a. Thus, the second storage electrode 156 reduces or prevents variation of the voltage of the driving gate electrode 155a from affecting a voltage of the pixel electrode 191 that overlaps driving gate electrode 155a.

An interlayer insulating layer 160 is formed on the second gate insulating layer 142 and the second gate wires 157 and 156. The interlayer insulating layer 160 may be include, for example, a silicon nitride (SiNx) or a silicon oxide (SiOx).

The contact holes 61, 62, 63, 64, 65, 66, and 69 are formed in the interlayer insulating layer 160. Data wires include the data line 171, the driving voltage line 172, the first data connection member 174, the second data connection member 175, and the third data connection member 179 are formed on the interlayer insulating layer 160.

The data line 171 is connected to the switching source electrode 136b through the contact hole 62 in the first gate insulating layer 141, the second gate insulating layer 142, and the interlayer insulating layer 160. The first end of the first data connecting member 174 is connected to the first storage electrode 15a through the contact hole 61 in the second gate insulating layer 142 and the interlayer insulating layer 160. The second end of the first data connecting member 174 is connected to the compensation drain electrode 137c and the initialization drain electrode 137d through the contact hole 63 in the first gate insulating layer 141, the second gate insulating layer 142, and the interlayer insulating layer 160.

The second data connecting member 175 extends in parallel with the data line 171 and is connected to the initialization source electrode 136d through the contact hole 64 in the first gate insulating layer 141, the second gate insulating layer 142, and the interlayer insulating layer 160. In addition, the third data connecting member 179 is connected to the emission control drain electrode 137f through the contact hole 66 in the first gate insulating layer 141, the second gate insulating layer 142, and the interlayer insulating layer 160.

A passivation layer 180 covers the data wires 171, 172, 174, 175, and 179 and the interlayer insulating layer 160 and is formed on the data wires 171, 172, 174, 175, and 179 and the interlayer insulating layer 160. The passivation layer 180 may be or include an organic layer.

The pixel electrode 191 and the initialization voltage line 192 are formed on the passivation layer 180. The third data connecting member 179 is connected to the pixel electrode 191 through the contact hole 81 formed in the passivation layer 180. The second data connecting member 175 is connected to the initialization voltage line 192 through the contact hole 82 formed in the passivation layer 180.

A pixel defining layer (PDL) 350 covering the passivation layer 180, the initialization voltage line 192, and an edge of the pixel electrode 191 is formed thereon. The pixel defining layer 350 includes a pixel opening 351 exposing the pixel electrode 191. The pixel defining layer 350 includes, for example, a resin such as a polyacrylate resin and a polyimide or a silica-based inorganic material.

An organic emission layer 370 is formed on the pixel electrode 191 exposed by the pixel opening 351. A common electrode 270 is formed on the organic emission layer 370 and the pixel defining layer 350 for the plurality of pixels PX. Thus, an organic light emitting diode OLED including the pixel electrode 191, the organic emission layer 370, and the common electrode 270 is formed.

The pixel electrode 191 serves as an anode which is a hole injection electrode, and the common electrode 270 serves as a cathode which is an electron injection electrode. In another embodiment, according to the driving method of the display device, the pixel electrode 191 serves as the cathode and the common electrode 270 as the anode. In operation, holes and electrons are injected into the organic emission layer 370 from the pixel electrode 191 and the common electrode 270, respectively. Excitons generated based on a combination of the injected holes and electrons fall from an excited state to a ground state to emit light. The display device may or may not be a foldable display device.

The organic emission layer 370 may include, for example, a low-molecular organic material or a high-molecular organic material such as poly(3,4-ethylenedioxythiophene) (PEDOT). Further, the organic emission layer 370 may have a multilayer structure including an emission layer and one or more of a hole injection layer (HIL), a hole transporting layer (HTL), an electron transporting layer (ETL), or an electron injection layer (EIL). When the organic emission layer 370 includes all of these layers, the hole injection layer (HIL) may be on the pixel electrode 191 serving as an anode and the hole transporting layer (HTL), the emission layer, the electron transporting layer (ETL), the electron injection layer (EIL) are sequentially laminated thereon.

The organic emission layer 370 may include a red organic emission layer emitting red light, a green organic emission layer emitting green light, and a blue organic emission layer emitting blue light. The red organic emission layer, the green organic emission layer, and the blue organic emission layer are formed in a red pixel, a green pixel, and a blue pixel, respectively, to thereby implement a color image.

Further, the organic emission layer 370 may implement the color image by laminating the red organic emission layer, the green organic emission layer, and the blue organic emission layer together in the red pixel, the green pixel, and the blue pixel, and forming a red color filter, a green color filter, and a blue color filter for each pixel.

In another example, white organic emission layers emitting white light are formed in all of the red pixel, the green pixel, and the blue pixel. Also, a red color filter, a green color filter, and a blue color filter are formed for each pixel to thereby implement a color image. When implementing a color image using the white organic emission layer and the color filters, a deposition mask for depositing the red organic emission layer, the green organic emission layer, and the blue organic emission layer on respective pixels (e.g., the red pixel, the green pixel, and the blue pixel) may not be used.

In accordance with another embodiment, the white organic emission layer may be formed by one organic emission layer or a plurality of laminated organic emission layers to emit white light. For example, the white organic emission layer may emit white light by combining at least one yellow organic emission layer and at least one blue light emitting layer, by combining at least one cyan organic emission layer and at least one red light emitting layer, or by combining at least one magenta organic emission layer and at least one green light emitting layer.

An encapsulation member to protect the organic light emitting diode OLED may be formed on the common electrode 270. The encapsulation member may be encapsulated on the substrate 110 by a sealant and may be made of various materials, e.g., glass, quartz, ceramic, plastic, or metal. A thin film encapsulation layer may be formed by depositing an inorganic layer and an organic layer on the common electrode 270 without using the sealant.

By way of summation and review, parasitic capacitance may occur between the driving gate node of the driving transistor and a data line and/or between the driving gate node of the driving transistor and an overlapped portion of a scan line. As a result, a voltage change in the data line or a scan signal of the scan line may affect the voltage of the driving gate node of the driving transistor. This, in turn, may change the driving current flowing to the organic light emitting diode, thereby causing vertical crosstalk that generates luminance variation that deteriorates display quality.

One approach which has been proposed in an attempt to prevent crosstalk involves forming a large gap between the data line and the driving gate node. However, this approach may be inadequate and may not be able to be performed in all cases. For example, in a high-resolution display, the size of the pixels is very small and thus may not accommodate formation of the gap. Also, process design rules may not be able to be gradually reduced due to limits in equipment specification and photolithography capacity. These effects deter efforts to minimize pixel size and also prevent any significant reduction in vertical crosstalk.

In accordance with one or more of the aforementioned embodiments. an extended portion of a second storage electrode to which the driving voltage is applied is located in an overlapped portion between the first data connecting member and the scan line. As a result, parasitic capacitance in the overlapped portion between the first data connecting member and the scan line may be reduced or prevented.

Accordingly, a kickback voltage caused by parasitic capacitance may be reduced or minimized, so that variation of the driving gate voltage Vg of the driving gate electrode connected to the first data connecting member, which is the driving gate node, may be reduced, thereby minimizing vertical crosstalk.

In addition, the data voltage may be increased by reducing or minimizing the kickback voltage caused by parasitic capacitance. Therefore, the driving range of the driving gate-source voltage between the driving gate electrode and the driving source electrode connected to the first data connecting member may be increased. Accordingly, a gray scale value of light emitted from the organic light emitting diode may be more finely controlled. As a result, resolution of the OLED display may be enhanced and display quality improved.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. An organic light emitting diode (OLED) display, comprising:
   a substrate;
   a scan line, on the substrate, to transmit a scan signal;
   a data line and a driving voltage line, crossing the scan line, to respectively transmit a data voltage and a driving voltage;
   a switching transistor connected to the scan line and the data line;
   a driving transistor connected to the switching transistor;
   a compensation transistor to compensate a threshold voltage of the driving transistor, the compensation transistor to turn on according to the scan signal and connected to a driving drain electrode of the driving transistor;
   a first data connector to connect a compensation drain electrode of the compensation transistor and a driving gate electrode of the driving transistor;
   a second storage electrode overlapping a first storage electrode corresponding to the driving gate electrode and connected to the driving voltage line; and
   an OLED connected to the driving transistor, wherein an extended portion of the second storage electrode is in an overlapped portion between the first data connector and the scan line.

2. The display as claimed in claim 1, further comprising:
   a first gate insulating layer, a second gate insulating layer, and an interlayer insulating layer sequentially formed on the substrate, wherein the second storage electrode is between the second gate insulating layer and the interlayer insulating layer.

3. The display as claimed in claim 2, wherein:
   the scan line is between the first gate insulating layer and the second gate insulating layer, and
   the first data connector is on the interlayer insulating layer.

4. The display as claimed in claim 3, wherein:
   the first storage electrode is between the first gate insulating layer and the second gate insulating layer, and
   the first storage electrode corresponds to the driving gate electrode.

5. The display as claimed in claim 4, wherein the second storage electrode entirely covers the first storage electrode.

6. The display as claimed in claim 2, wherein the first data connector is in a same layer as the data line and the driving voltage line.

7. The display as claimed in claim 6, wherein:
   the first data connector has a first end connected to the driving gate electrode through a contact hole in the second gate insulating layer and the interlayer insulating layer and a second end connected to the compensation drain electrode of the compensation transistor through a contact hole in the first gate insulating layer, the second gate insulating layer, and the interlayer insulating layer.

8. The display as claimed in claim 7, wherein:
   the second storage electrode includes a storage opening exposing the second gate insulating layer, and
   a contact hole through which the first end of the first data connector and the driving gate electrode are connected is in the storage opening.

9. The display as claimed in claim 8, wherein the first data connector is separated from the data line on a same plane.

10. The display as claimed in claim 2, wherein a driving channel of the driving transistor is bent on a same plane.

11. The display as claimed in claim 2, wherein the OLED includes:
    a pixel electrode connected to the driving transistor;
    an organic emission layer on the pixel electrode; and
    a common electrode on the organic emission layer, the pixel electrode separated from the first data connector on as same plane.

12. The display as claimed in claim 11, further comprising:
    a passivation layer covering the data line, the driving voltage line, and the first data connector;
    a pixel defining layer covering, an edge of the pixel electrode on the passivation layer; and
    an initialization voltage line in a same layer as the pixel electrode, the initialization voltage line to transmit an initialization voltage to initialize the driving transistor.

13. A pixel, comprising:
    a switching transistor connected to a scan line;
    a driving transistor connected to the switching transistor;
    a compensation transistor to compensate a threshold voltage of the driving transistor based on a scan signal;
    a first data connector to connect the compensation transistor to the driving transistor;
    a first storage electrode corresponding to a gate electrode of the driving transistor; and
    a second storage electrode overlapping a first storage electrode, wherein the second storage electrode includes an extended portion which overlaps the first data connector and the scan line.

14. The pixel as claimed in claim 13, wherein the second storage electrode is between a second gate insulating layer and an interlayer insulating layer.

15. The pixel as claimed in claim 14, wherein:
    the scan line is between a first gate insulating layer and the second gate insulating layer, and
    the first data connector is on the interlayer insulating layer.

16. The pixel as claimed in claim 15, wherein:
the first storage electrode is between the first gate insulating layer and the second gate insulating layer, and
the first storage electrode corresponds to the driving gate electrode.

17. The pixel as claimed in claim 16, wherein the second storage electrode entirely covers the first storage electrode.

18. The pixel as claimed in claim 13, wherein the first data connector is in a same layer as a data line and a driving voltage line.

19. The pixel as claimed in claim 13, wherein the first data connector is separated from a data line on a same plane.

20. The pixel as claimed in claim 13, wherein a driving channel of the driving transistor curves on a same plane.

* * * * *